United States Patent
Lin et al.

(10) Patent No.: US 6,768,332 B2
(45) Date of Patent: Jul. 27, 2004

(54) SEMICONDUCTOR WAFER AND TESTING METHOD FOR THE SAME

(75) Inventors: Yueh Lung Lin, Taoyuan (TW); Ho Ming Tong, Taipei (TW); Yao Hsin Feng, Hualien (TW); Su Tao, Kaohsiung (TW); Chi Cheng Pan, Kaohsiung (TW); Kuo Pin Yang, Kaohsiung (TW); Sung Ching Hung, Changhua (TW)

(73) Assignee: Advanced Semiconductor Engineering Inc. (TW)

( * ) Notice: Subject to any disclaimer, the term of this patent is extended or adjusted under 35 U.S.C. 154(b) by 0 days.

(21) Appl. No.: 10/385,565

(22) Filed: Mar. 12, 2003

(65) Prior Publication Data

US 2004/0021479 A1 Feb. 5, 2004

(30) Foreign Application Priority Data

Jul. 31, 2002 (TW) ....................................... 91117403 A

(51) Int. Cl.$^7$ ............................................... G10R 31/26
(52) U.S. Cl. ..................................... 324/765; 324/158.1
(58) Field of Search ................................. 324/765, 754, 324/758, 158.1; 438/15, 11, 460, 400, 458

(56) References Cited

U.S. PATENT DOCUMENTS

| | | | | |
|---|---|---|---|---|
| 5,479,109 A | * | 12/1995 | Lau et al. | 324/758 |
| 5,917,332 A | * | 6/1999 | Chen et al. | 324/765 |
| 6,480,012 B1 | * | 11/2002 | Komori | 324/754 |
| 6,576,529 B1 | * | 6/2003 | Boulin et al. | 438/401 |

* cited by examiner

Primary Examiner—David A. Zarneke
Assistant Examiner—Tung X. Nguyen

(57) ABSTRACT

A semiconductor wafer includes a plurality of areas and an array of dice disposed within each of the areas. The feature of the present invention is that at least two fiducial marks are disposed in each of the areas. The present invention further provides a method of testing a sawed semiconductor wafer.

14 Claims, 5 Drawing Sheets

SEMICONDUCTOR WAFER AND TESTING METHOD FOR THE SAME

BACKGROUND OF THE INVENTION

1. Field of the Invention

This invention relates to a semiconductor wafer and a method for testing a diced semiconductor wafer.

2. Description of the Related Art

The manufacture of semiconductor integrated circuits includes a multitude of processes including design, manufacture, packaging, and testing. Testing is divided into functional, parametric, and burn-in methodologies. In each of these methodologies, the devices may be tested in wafer, die, or packaged form. Although packaging is a comparatively expensive step, semiconductor manufacturers often package the devices before testing, that is, prior to ensuring proper device operation. The high cost of packaging devices coupled with the increased complexity of the device structures has forced manufacturers to test the devices before packaging, in wafer or die form. By doing so, the probability of packaging malfunctional devices is decreased. Further, with the advent of multichip modules, wafer or die level testing is required since the semiconductor device is only one of several components mounted on a multichip carrier. If one of the semiconductor devices of the multichip module has defects, the whole module would become malfunctional and thus be eliminated. It wastes much manufacturing cost. Therefore, die or wafer level testing is very necessary in such cases.

Generally, integrated circuits are fabricated on semiconductor wafers, and each wafer typically contains between 50 and 1,000 individual integrated circuits. Between the integrated circuits are spaces, known as "street indices", which separate the individual integrated circuits on the wafer. In a process known as "dicing", wafers are cut along the street indices to form separate integrated circuits, known as "dice".

The individual integrated circuits are disposed in an array and arranged regularly; therefore, using wafer level testing can greatly lower the testing time and cost. Currently, semiconductor wafers are tested prior to singulation into individual dice. One of the important reasons is described below. Wafer level testing is typically conducted by using the center of the entire wafer as a fiducial point to position each die. However, there are slight deviations in the coordinates of the dice after the dicing process from the original coordinates of the dice. The slight deviations of individual dice result in big problems during the testing process and cause some of the to-be-tested dice unable to be exactly aligned with the interconnect contacts of a testing machine such that the testing machine can't proceed the testing process or test the dice correctly. But it should be noted that the dicing process is also one of the important causes of damaging the integrated circuits. Since conventional testing processes are conducted prior to the dicing process, only the characteristics and functions of the integrated circuits before the dicing process are verified. However, it can't be judged from the conventional testing processes if the integrated circuits are damaged during the dicing process or not.

Therefore, there exists a need for a testing method that can overcome or at least reduce the aforementioned problems of the prior arts.

SUMMARY OF THE INVENTION

It is an object of the present invention to provide a method for testing a diced wafer thereby overcoming or reducing the position deviation problem of dice due to the dicing process while allowing all of the dice arranged in an array on a wafer to be tested sequentially thereby saving the testing time and expenses thereof.

To achieve the above listed and other objects, the present invention provides a semiconductor wafer comprising a plurality of areas and an array of dice disposed within each of the areas. The present invention is characterized in that at least two fiducial marks are provided in each area of the wafer. According to one embodiment of the present invention, the at least two fiducial marks are disposed in two diagonal corners of each area. The fiducial marks can be patterns in the shape of a cross or other shapes.

The present invention further provides a method for testing a diced wafer. The method comprises the steps as below. First, the surface of a diced wafer is divided into a plurality of areas each including at least two fiducial marks and a plurality of dice each having a plurality of contacts, e.g., bumped contacts. The at least two fiducial marks are not limited to patterns in the shape of a cross or other shapes; alternatively, they may be right-angle edges or circuit features of the dice on the wafer. Next, coordinates of each of the dice within one of the areas is provided by a pattern recognition system through searching and aligning the at least two fiducial marks of the area. After that, interconnect contacts of a prober are placed in electrical communication with the electrical contacts of the dice of the first area according to the obtained coordinates thereof. Thereafter, the pattern recognition system searches and aligns the at least two fiducial marks of any other area thereby obtaining coordinates of the dice within this area of the wafer. In this way, the interconnect contacts of the prober are placed in electrical communication with the electrical contacts of the dice of each area according to the obtained coordinates thereof.

The present invention further provides a method for determining the number of the areas defined on the wafer. Firstly, the surface of a diced wafer is divided into N areas, wherein each area comprises an array of dice and at least two fiducial marks. Next, coordinates of all dice within one of N areas of the diced wafer are provided by a pattern recognition system through searching and aligning the at least two fiducial marks of the area. According to the coordinates obtained in the previous step, interconnect contacts of a prober are moved toward the electrical contacts of the dice; meanwhile, the position deviation between the interconnect contacts of the prober and the electrical contacts of the dice is evaluated. When the position deviation is larger than a predetermined allowable deviation value, the steps of dividing the surface of the diced wafer, obtaining the coordinates and evaluating the position deviation are repeated but the number of the areas is increased at least one at a time until the position deviation obtained in the position deviation evaluating step is smaller than the predetermined allowable deviation value thereby determining that the wafer should be divided into f areas. Therefore, the optimum number of the areas defined on the wafer is f. Thereafter, the dice within each area are tested in the same way as the aforementioned testing method.

The testing method of the present invention not only has the feature of wafer level testing (i.e., testing all of the dice arranged in an array on a wafer), but also has the feature of die level testing to confirm if each die is operational or not thereby obtaining known good dice.

In order to make other objects, advantages, and novel features of the invention become more apparent, detailed description about some preferred embodiment of the present invention will be taken in conjunction with the accompanying drawings as below.

DETAILED DESCRIPTION OF THE PREFERRED EMBODIMENT

Figure 1:
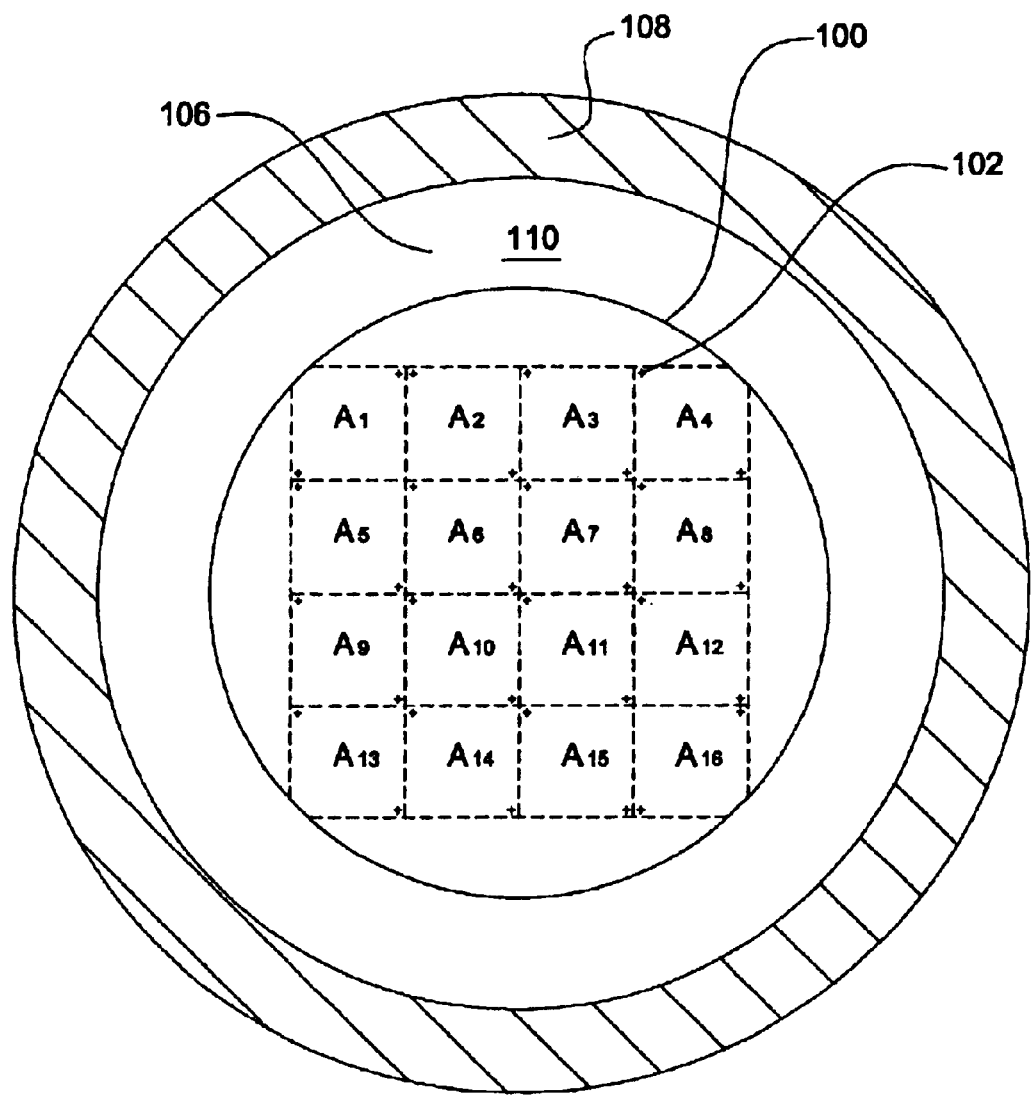
FIG. 1 is a top view of a semiconductor wafer and other fastening device according to one embodiment of the present invention.
Figure 2:
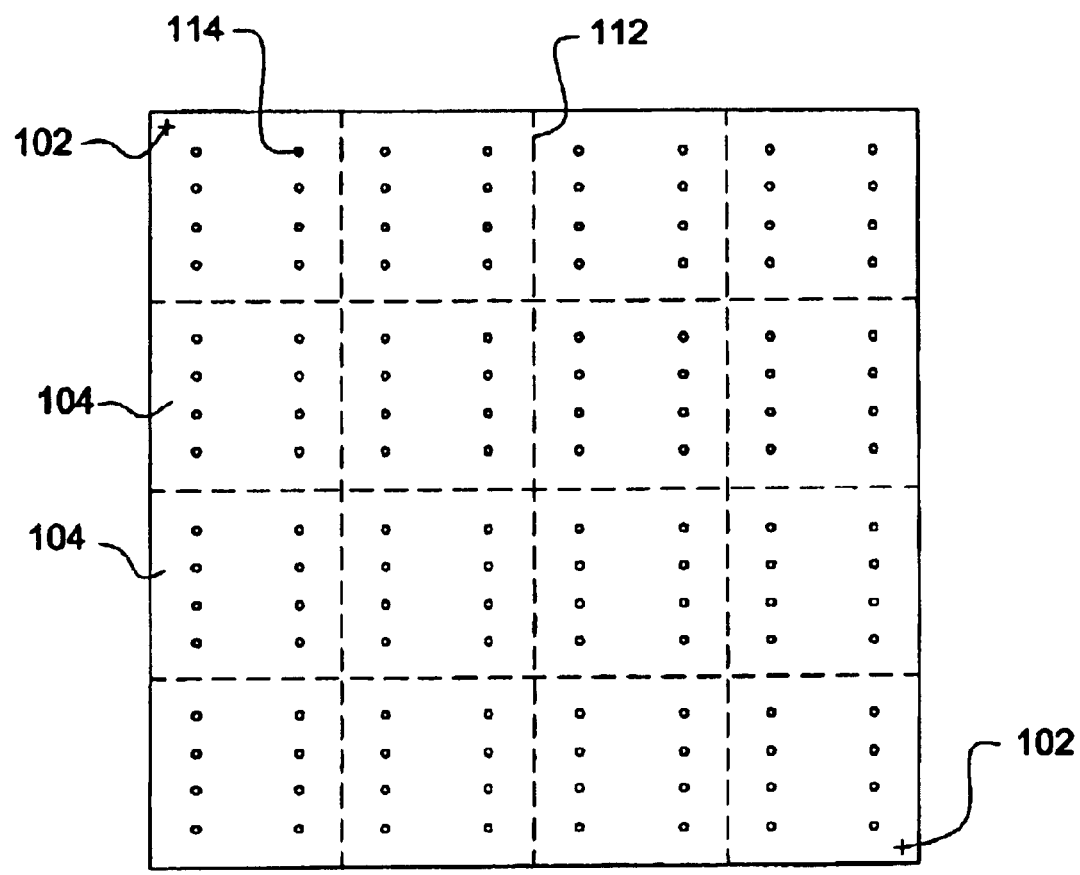
FIG. 2 is a top view of area $A_2$ of the wafer shown in FIG. 1 before being subjected to a dicing process on an enlarged scale.

Referring to FIG. 1, the device designated as 100 is a semiconductor wafer according to one embodiment of the present invention. The semiconductor wafer 100 mainly comprises a plurality of areas $A_1$–$A_{16}$, and two fiducial marks 102 in the shape of a cross disposed in two diagonal corners of each area. FIG. 2 is a top view of area $A_2$ on an enlarged scale and shows an array of dice 104 disposed in area $A_2$. The fiducial marks can be patterns in other shapes.

Figure 3:
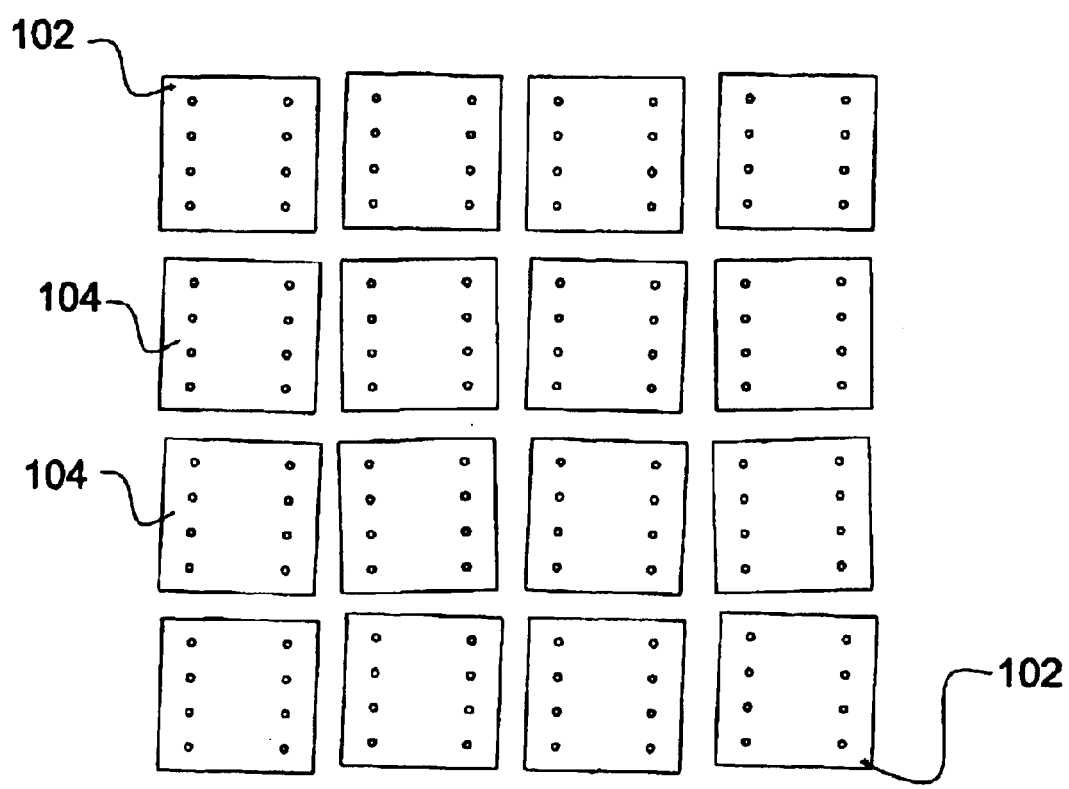
FIG. 3 is a top view of area $A_2$ of the wafer shown in FIG. 1 after being subjected to a dicing process on an enlarged scale.

The present invention provides a testing method utilizing the aforementioned semiconductor wafer 100. The method is suitable for use in testing a diced wafer. As shown in FIG. 1, wafer dicing process generally comprises the steps of attaching a wafer 100 which is going to be sawed to an adhesive tape 106 which is secured within a central opening 110 of a wafer frame 108, securing the wafer frame to a dicing machine, and cutting the wafer with a blade along the street indices 112 (see FIG. 2) on the wafer thereby obtaining a plurality of dice 104 (see FIG. 3). As shown in FIG. 3, although the wafer 100 is cut into a plurality of dice 104, they are still attached on the adhesive tape 106; therefore, the arrangement of the dice are still kept in an array. But the relative location of the dice is changed after the dicing conducted by the blade. The present invention is characterized in that the dice on the aforementioned wafer 100 are positioned from areas $A_1$ to $A_{16}$, respectively. Therefore, the operator can correctly position and test the dice of a sawed wafer thereby overcoming or at least reducing the position deviation problems of the dice due to the dicing process.

Figure 4:
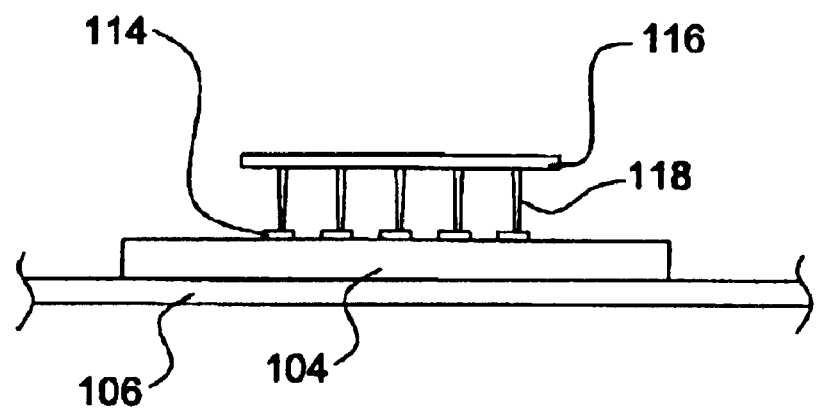
FIG. 4 is a cross sectional view of the temporary electrical connection between the prober and the dice which are going to be tested according to one embodiment of the present invention.

The testing method provided by the present invention comprises the following steps. Firstly, the aforementioned diced wafer with its surface divided into a plurality of areas is used. As shown in FIG. 1, the surface of the wafer is divided into areas $A_1$–$A_{16}$. As shown in FIG. 3, each area includes a plurality of dice 104 and at least two fiducial marks 102. In this method, the at least two fiducial marks are just used to locate the dice within one area. Therefore, the fiducial marks are not limited to extra patterns formed on the wafer; alternatively, they may be right-angle edges or circuit features of at least two dice disposed in two diagonal corners of each area. Referring to FIG. 4, each die 104 includes a plurality of electrical contacts 114.

Thereafter, an area (e.g., area $A_2$) is chosen to be positioned. A pattern recognition system provides all coordinates of the dice 104 within area $A_2$ through searching and aligning the two cross fiducial marks 102 of the area $A_2$.

As shown in FIG. 4, according to the coordinates of each die 104 within area $A_2$, interconnect contacts 118 of a prober 116 is placed in electrical communication with the electrical contacts 114 of the dice 104 within area $A_2$. A suitable prober 116 may be a probe card which is commonly used in wafer level testing system.

It should be noticed that, after obtaining all coordinates of the dice 104 within area $A_2$, the electrical contacts 114 of all dice 104 within the area may be tested simultaneously, may be tested in batches or may be tested in the way of one die 104 at a time according to the design of the prober 116.

After that, next area, e.g., area $A_3$, is subjected to the aforementioned positioning and testing steps. The aforementioned steps are repeated until the dice 104 within all areas on the wafer have been tested.

Figure 6A:
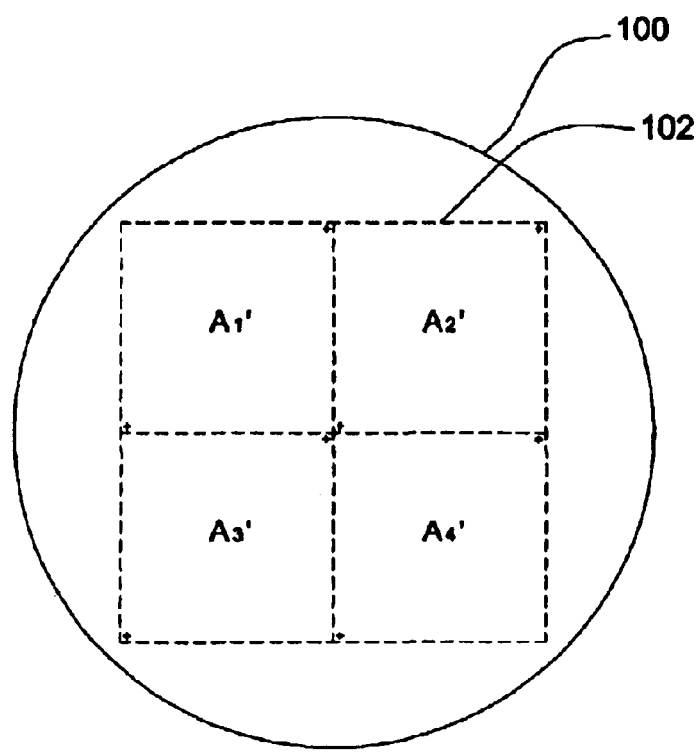
FIG. 6a is a top view of a semiconductor wafer according to another embodiment of the present invention.

The present invention significantly reduces the position deviation of separated dice by positioning the dice within individual small areas. The present invention further provides a method for determining the number of the areas defined on the wafer. At first, a diced wafer 100 is used. The wafer 100 comprises an array of dice 104 and each die has a plurality of electrical contacts 114. Then, referring to FIG. 6a, the surface of the diced wafer 100 is divided into four areas $A_1'$–$A_4'$, wherein each area comprises at least two fiducial marks 102. A pattern recognition system provides all coordinates of the dice within the area $A_1'$ through searching and aligning the at least two fiducial marks of the area.

Figure 6B:
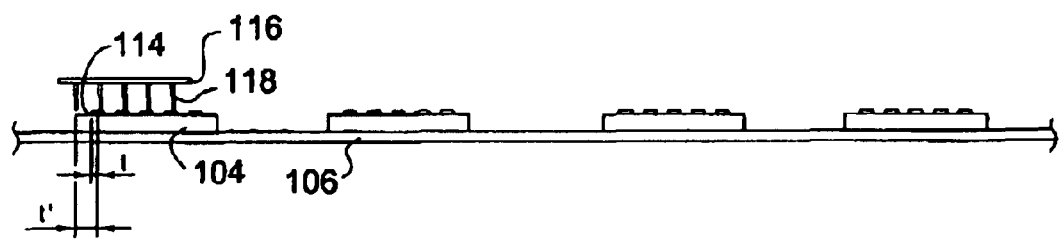
FIG. 6b illustrates, in a cross-sectional view, a step of moving the prober toward the dice which are going to be tested within area $A_1'$ of the semiconductor wafer of FIG. 6a, and evaluating the position deviation between the prober and the dice.

Referring to FIG. 6b, according to the coordinates of the dice 104 within area $A_1'$ which is obtained in the previous step, the interconnect contacts of the prober 116 is moved toward the electrical contacts 114 of the die 104; meanwhile, the position deviation between the interconnect contacts 118 of the prober 116 and the electrical contacts 114 of the die 104 is evaluated. According to one embodiment of the present invention, the interconnect contacts 118 of the prober 116 are most preferably aligned with the geometric centers of the electrical contacts 114 of the dice 104. Therefore, the distance t' between the interconnect contacts 118 of the prober 116 and the geometric centers of the contacts 114 of the dice 104 is defined as the position deviation between the interconnect contacts 118 of the prober 116 and the center of the contacts 114 of the dice 104.

In the evaluating step mentioned above, if the position deviation t' is larger than the radius (or a half of the width) t of the contacts 114, it become extremely difficult, if not impossible, to place the interconnect contacts 118 of the prober 116 in electrical communication with the contacts 114 of the dice 104. Therefore, the number of the areas defined on the wafer 100 must be increased at least one at a time to further reduce the territory of each area defined on the wafer. And then, the steps of obtaining the coordinates and evaluating the position deviation for newly defined areas are repeated until the position deviation t' obtained in the position deviation evaluating step is smaller than the predetermined allowable deviation value t thereby determining the optimum number of areas defined in the wafer. Thereafter, the surfaces of all the wafer in the same batch may be divided into areas in accordance with the optimum number of areas obtained above and subjected to the aforementioned positioning step and testing step one area after another.

Figure 5:
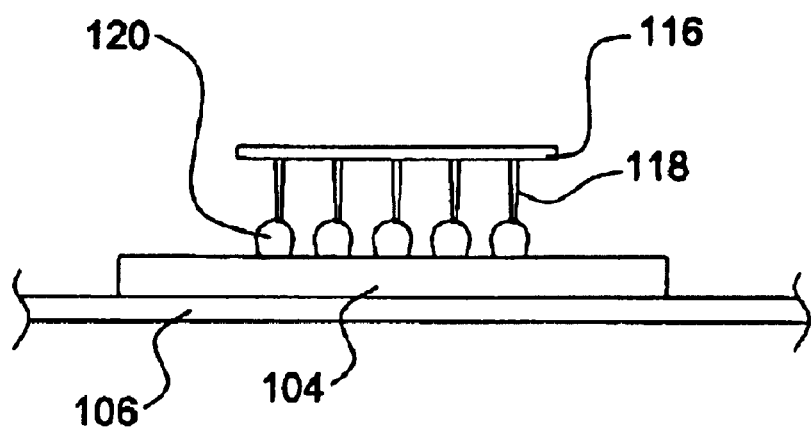
FIG. 5 is a cross sectional view of the temporary electrical connection between the prober and the bumped dice which are going to be tested according to another embodiment of the present invention.

The present invention provides a wafer level testing method which can overcome or at least reduce the positioning problem caused by position deviation after the dicing process. The method is not only suitable to be used in testing bare wafer but also suitable to be used in testing bumped wafer (as shown in FIG. 5). The method can be used to make the interconnect contact 118 of the prober 116 form a temporary electrical connection with the bumped contacts 120 of the diced bumped wafer.

Although the invention has been explained in relation to its preferred embodiments, it is to be understood that many other possible modifications and variations can be made without departing from the spirit and scope of the invention as hereinafter claimed. For example, although only two-layer structure is illustrated as preferred embodiments, the multi-chip modules with three-layer structure or above are still considered within the spirit and scope of the invention.

What is claimed is:

1. A testing method comprising the steps of:

providing a diced wafer comprising at least a first area and a second area, wherein both the first area and the second area include at least two fiducial marks and an array of dice each having a plurality of electrical contacts;

providing a prober having a plurality of interconnect contacts;

searching the at least two fiducial marks in the first area of the wafer and obtaining all coordinates of the dice within the first area of the wafer by a pattern recognition system;

placing the interconnect contacts of the prober in electrical communication with the electrical contacts of the dice of the first area according to the coordinates of the dice within the first area;

searching the at least two fiducial marks in the second area of the wafer and obtaining all coordinates of the dice of the second area of the wafer by the pattern recognition system; and placing the interconnect contacts of the prober in electrical communication with the electrical contacts of the dice of the second area according to the coordinates of the dice within the second area.

2. The testing method as claimed in claim 1, wherein the electrical contacts of the dice comprise bumped contacts.

3. The testing method as claimed in claim 1, wherein the at least two fiducial marks are disposed in two diagonal corners of the first area.

4. The testing method as claimed in claim 1, wherein the at least two fiducial marks are patterns.

5. The testing method as claimed in claim 1, wherein the at least two fiducial marks are right-angle edges of two dice disposed in two diagonal corners of the first area.

6. The testing method as claimed in claim 1, wherein the at least two fiducial marks are circuit features of two dice disposed in two diagonal corners of the first area.

7. The testing method as claimed in claim 1, wherein the at least two fiducial marks are patterns in the shape of a cross.

8. A testing method comprising the steps of:

a) providing a diced wafer comprising an array of dice each having a plurality of electrical contacts;

b) providing a prober having a plurality of interconnect contacts;

c) dividing the surface of the diced wafer into N areas, wherein each area includes at least two fiducial marks;

d) searching the at least two fiducial marks in one of the N areas of the diced wafer and obtaining all coordinates of the dice in the area by a pattern recognition system;

e) moving the interconnect contacts of the prober toward the electrical contacts of each die according to all coordinates of the dice obtained in step d) and evaluating the position deviation between the interconnect contacts of the prober and the electrical contacts of the dice;

f) when the position deviation is larger than a predetermined allowable deviation value, repeating step c) to step d) but increasing the number of the areas at least one at a time until the position deviation obtained from step e) is smaller than the predetermined allowable deviation value thereby determining that the wafer should be divided into f areas each area including at least two fiducial marks;

g) after conducting the step f), searching the at least two fiducial marks in one of the f areas of the diced wafer and obtaining all coordinate of the dice in the area by a pattern recognition system;

h) placing the interconnect contacts of the prober in electrical communication with the electrical contacts of each die according to all coordinates of the dice obtained in step g).

9. The testing method as claimed in claim 8, wherein the electrical contacts of the dice are bumped contacts.

10. The testing method as claimed in claim 8, wherein the at least two fiducial marks are disposed in two diagonal corners of each area.

11. The testing meted as claimed in claim 8, wherein the at least two fiducial marks are patterns.

12. The testing method as claimed in claim 8, wherein the at least two fiducial marks are right-angle edges of two dice disposed in two diagonal corners of each area.

13. The testing method as claimed in claim 8, wherein the at least two fiducial marks are circuit features of two dice disposed in two diagonal corners of each area.

14. The testing method as claimed in claim 8, wherein the at least two fiducial marks are patterns in the shape of a cross.

* * * * *